United States Patent
Yang et al.

(10) Patent No.: US 11,985,782 B2
(45) Date of Patent: May 14, 2024

(54) ENCLOSURE FITTING FOR ELECTRONIC DEVICE

(71) Applicant: Western Digital Technologies, Inc., San Jose, CA (US)

(72) Inventors: Bo Yang, Dublin, CA (US); Warren Middlekauff, San Jose, CA (US); Sean Lau, Penang (MY); Ning Ye, San Jose, CA (US); Shrikar Bhagath, San Jose, CA (US); Yangming Liu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/658,443

(22) Filed: Apr. 8, 2022

(65) Prior Publication Data
US 2023/0328910 A1    Oct. 12, 2023

(51) Int. Cl.
*H05K 7/14*    (2006.01)
*H05K 5/00*    (2006.01)

(52) U.S. Cl.
CPC ......... *H05K 7/1427* (2013.01); *H05K 5/0008* (2013.01); *H05K 7/1417* (2013.01)

(58) Field of Classification Search
CPC ... H05K 7/1427; H05K 5/0008; H05K 7/1417
See application file for complete search history.

(56) References Cited

U.S. PATENT DOCUMENTS

| | | | |
|---|---|---|---|
| 4,652,971 A | 3/1987 | Peterson et al. | |
| 6,490,165 B2* | 12/2002 | Mizusaki | H05K 7/142 361/752 |
| 7,028,389 B2* | 4/2006 | Chang | H05K 7/142 174/544 |
| 7,301,763 B2* | 11/2007 | Hara | G11B 33/08 348/E5.025 |
| 7,309,264 B2* | 12/2007 | Mizutani | H05K 5/006 439/810 |
| 7,385,830 B2* | 6/2008 | Liu | H05K 7/142 174/138 R |
| 7,583,516 B2* | 9/2009 | Lu | H05K 7/142 361/807 |
| 7,944,703 B2* | 5/2011 | Ni | G07C 9/257 361/728 |

(Continued)

*Primary Examiner* — Abhishek M Rathod
(74) *Attorney, Agent, or Firm* — Morgan, Lewis & Bockius LLP

(57) ABSTRACT

A data storage device includes an enclosure and a Printed Circuit Board Assembly (PCBA) extending in a basal plane, and a plurality of semiconductor memory packages electro-mechanically bonded to the PCBA and coupled to the enclosure with thermal interface material. The data storage device further includes a first fitting coupled to a first end of the PCBA and the enclosure, restricting movement of the PCBA in the basal plane with respect to the enclosure and restricting movement of the PCBA out of the basal plane. The data storage device further includes a second fitting coupled to a second end of the PCBA, allowing movement of the PCBA in the basal plane with respect to the enclosure and restricting movement of the PCBA out of the basal plane.

12 Claims, 6 Drawing Sheets

(56) References Cited

U.S. PATENT DOCUMENTS

| | | | | |
|---|---|---|---|---|
| 8,406,009 B2* | 3/2013 | Lev | ............ | H05K 1/0271 |
| | | | | 174/268 |
| 8,439,615 B2* | 5/2013 | Wu | ............ | H05K 7/1407 |
| | | | | 411/107 |
| 8,879,263 B2* | 11/2014 | Gunderson | ...... | H05K 5/0256 |
| | | | | 361/720 |
| 9,078,357 B2* | 7/2015 | Gunderson | ...... | H05K 5/0269 |
| 9,123,686 B2* | 9/2015 | Mataya | ......... | H01L 23/3677 |
| 9,761,290 B1* | 9/2017 | Kankani | ........ | G11C 5/04 |
| 9,798,361 B2* | 10/2017 | Kim | ............ | H05K 5/0256 |
| 9,851,762 B1* | 12/2017 | Baik | ............ | G06F 1/183 |
| 9,867,276 B2* | 1/2018 | Gwin | ........... | G06F 1/181 |
| 9,880,594 B2* | 1/2018 | Mataya | ......... | B82Y 10/00 |
| 10,051,763 B2* | 8/2018 | Cai | ............. | H01L 23/4006 |
| 10,085,364 B2* | 9/2018 | Voss | ............ | H05K 7/20436 |
| 10,194,551 B2* | 1/2019 | Nicoloff | ........ | B64C 1/06 |
| 10,244,645 B2* | 3/2019 | Kang | ........... | H05K 5/006 |
| 10,617,028 B2* | 4/2020 | Nicoloff | ........ | H05K 1/181 |
| 10,798,839 B2* | 10/2020 | Gao | ............. | G06F 1/203 |
| 11,147,179 B2* | 10/2021 | Nicoloff | ........ | H05K 5/0034 |
| 2007/0133187 A1* | 6/2007 | Lin | ............. | H05K 9/0039 |
| | | | | 361/759 |
| 2012/0281364 A1* | 11/2012 | Gunderson | ...... | H05K 5/0269 |
| | | | | 361/714 |
| 2016/0113129 A1* | 4/2016 | Raschke | ........ | H05K 5/006 |
| | | | | 361/759 |
| 2018/0302999 A1* | 10/2018 | Söhner | ......... | H05K 5/0082 |
| 2019/0326223 A1* | 10/2019 | Lee | ............. | H01L 23/3107 |
| 2021/0074641 A1* | 3/2021 | Sung | ........... | H01L 23/3121 |
| 2021/0320049 A1* | 10/2021 | Suzuki | ......... | H05K 1/189 |
| 2021/0385956 A1* | 12/2021 | Cinar | .......... | H05K 5/026 |
| 2022/0053656 A1* | 2/2022 | Lee | ............. | H05K 7/1417 |
| 2022/0115800 A1* | 4/2022 | Kim | ............ | H01R 13/44 |

\* cited by examiner

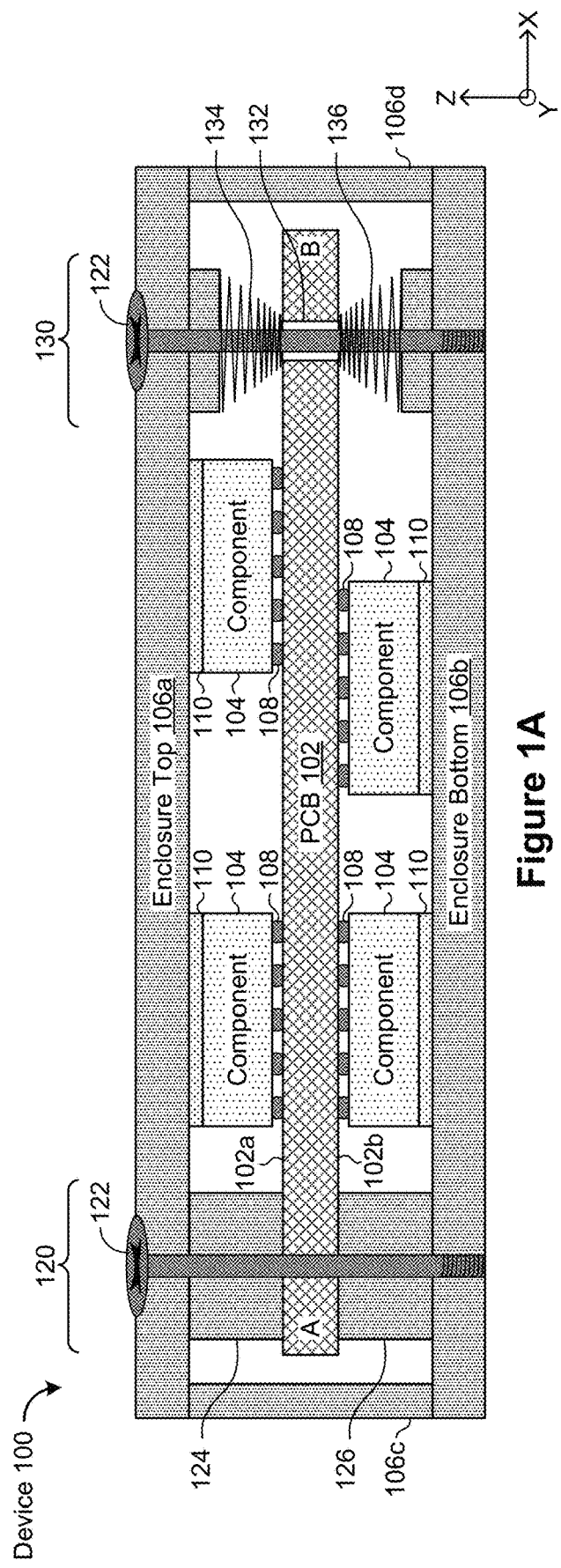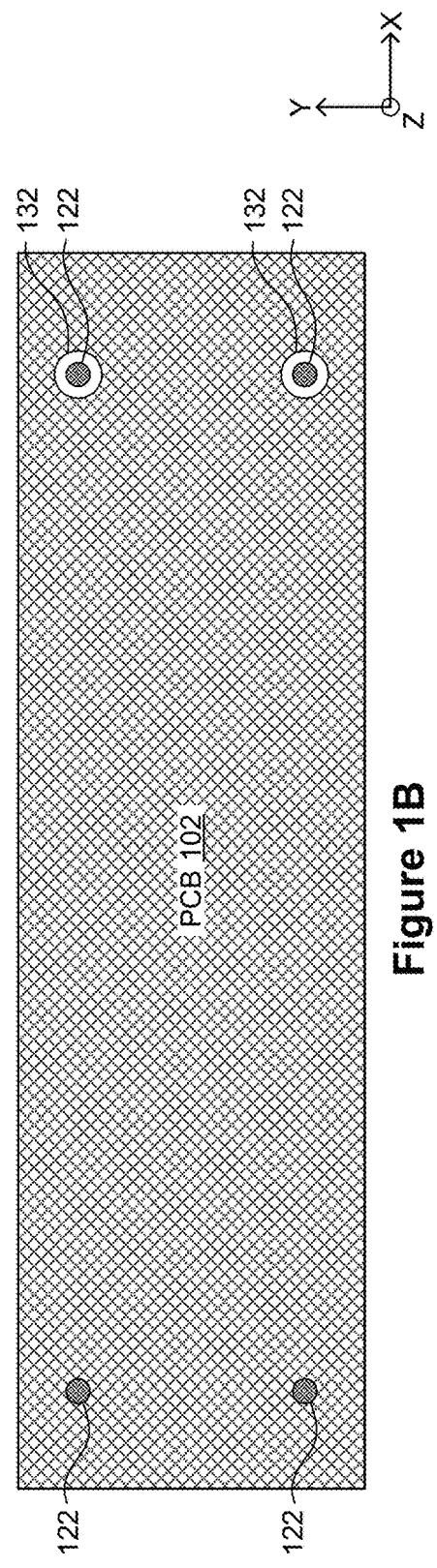
Figure 1A
Figure 1B

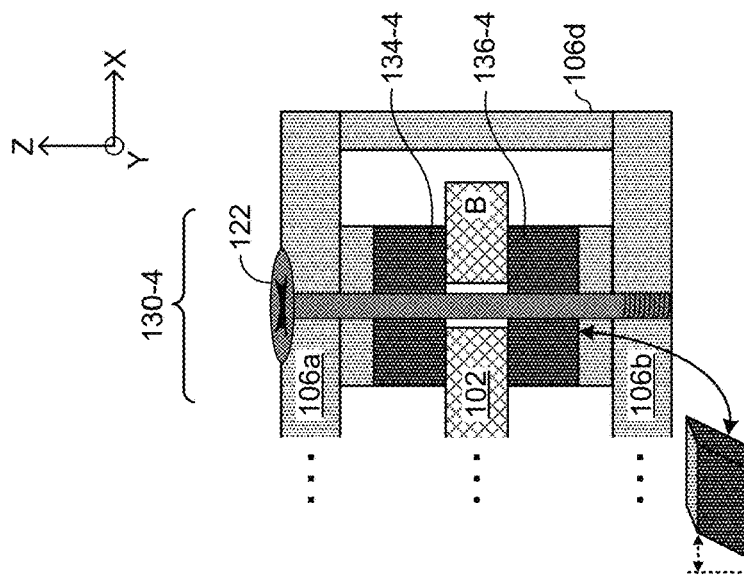
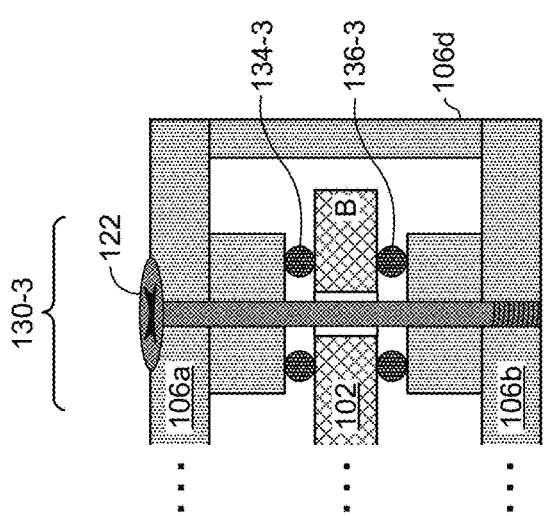
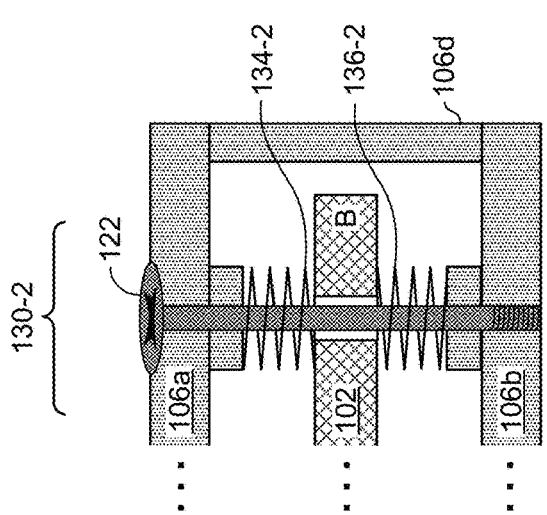

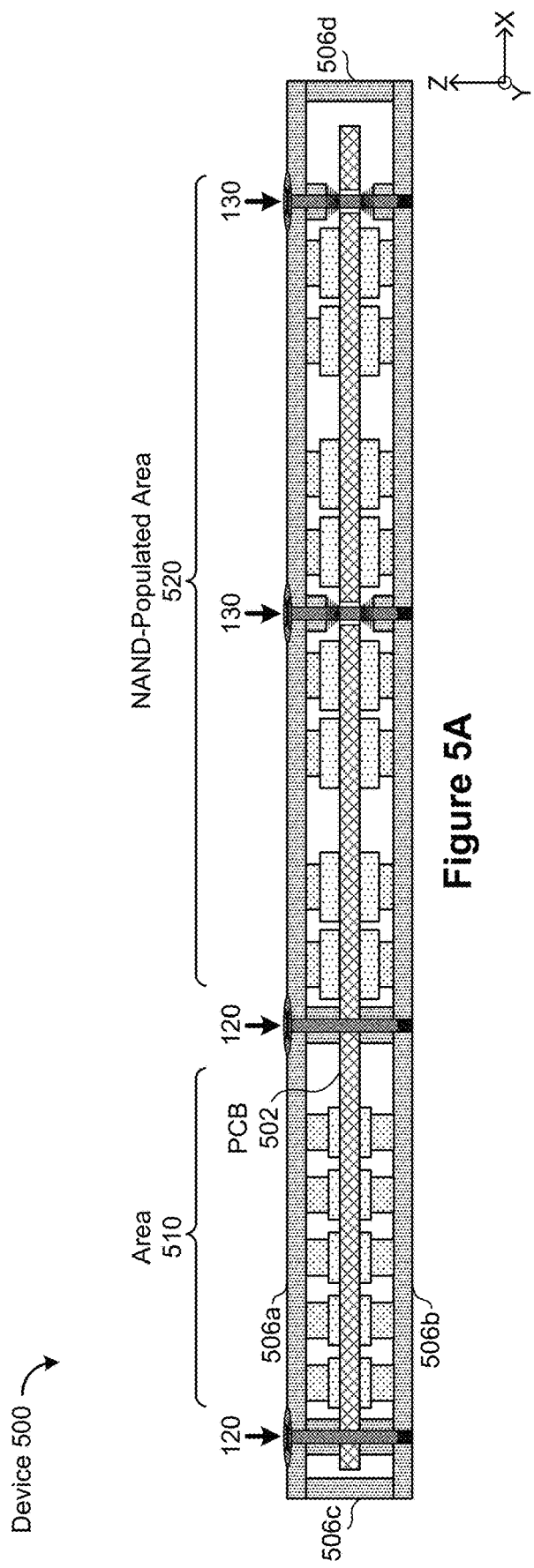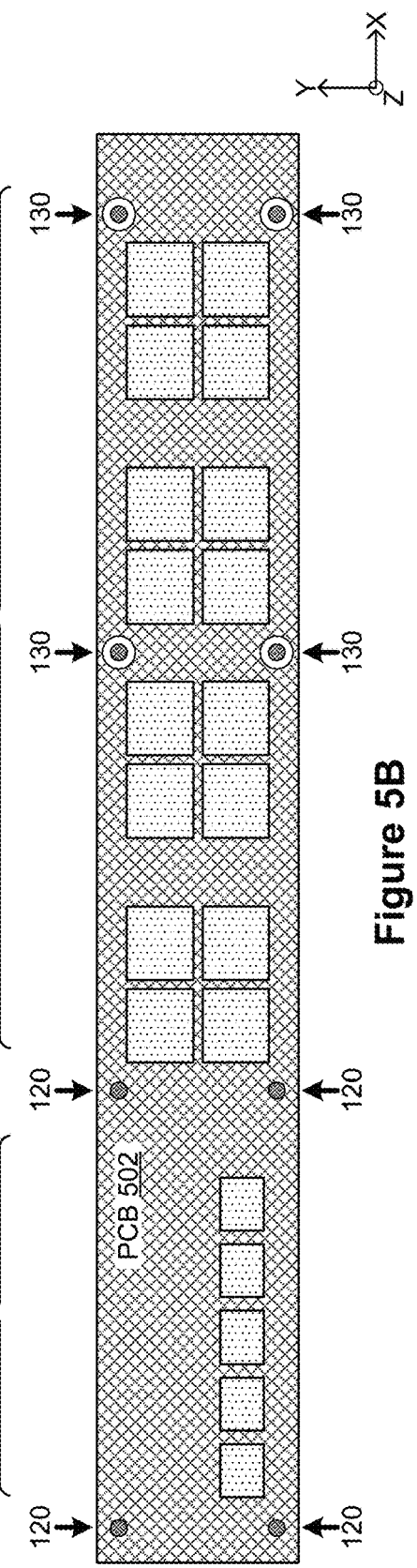

Basic Equations $$F_x^{PCB} = E\left(\Delta\alpha\Delta T - \frac{\delta_x}{L}\right)wt$$

$$F_x^{Spring} = 4k_x\delta_x$$

$$F_x^{PCB} = F_x^{Spring}$$

Targeted Residual Stress Ratio $\lambda$ $$F_x^{PCB} = \lambda F_{x,max}^{PCB} = \lambda E\Delta\alpha\Delta Twt$$

$$\boxed{\delta_x = (1-\lambda)\Delta\alpha\Delta TL}$$

Required Spring Shear Stiffness $$\boxed{k_x = \frac{\lambda Ewt}{4(1-\lambda)L}}$$

| PCB E (GPa) | PCB width w (mm) | PCB thick (mm) | PCB length (mm) |
|---|---|---|---|
| 40 | 35 | 1.57 | 300 |

| CTE delta (ppm/°C) | Temp delta (°C) |
|---|---|
| 10 | 150 |

| Resid. stress ratio $\lambda$ | Req. spring shear stiffness $k_x$ (N/mm) | Deflection $\delta_x$ (mm) |
|---|---|---|
| 0.3 | 785 | 0.32 |
| 0.2 | 458 | 0.36 |
| 0.1 | 203.5 | 0.41 |
| 0.01 | 18.5 | 0.45 |

Figure 6

ENCLOSURE FITTING FOR ELECTRONIC DEVICE

BACKGROUND

The high performance and large capacity of solid-state drive (SSD) data storage devices has been driving the continued growth of component density, complexity, and power consumption of these components on limited printed circuit board (PCB) space. Board-level solder joint reliability, especially for NAND components, is facing a critical challenge during new product development processes.

One such product development process, accelerated thermal cycle (ATC) testing, is performed on materials to determine the resistance of exposure to alternating extremes of high and low temperatures. Thermal mismatch of SSD materials subject to ATC testing can cause solder joint cracking, warpage, damage to leads and markings, and hermetic seal failures. SSDs assembled with protective enclosures suffer even greater risk of ATC failure, due to the large coefficient of thermal expansion (CTE) mismatch between internal components of the SSD and the enclosure.

SUMMARY

The present disclosure describes a semiconductor device package having internal components that are partially disengaged from the protective enclosure, thereby improving thermal cycling performance and decreasing the risk of ATC failure. The internal components of the SSD are coupled to a printed circuit board (PCB), which is partially coupled to the enclosure and disposed in a basal plane. The internal components and the enclosure are allowed to partially slide in the basal plane relative to each other, which appreciably improves the overall thermal cycling performance compared to conventional designs.

To enable the partial coupling of the enclosure to the PCB while adequately protecting the internal components of the SSD from external forces, the enclosure is assembled with its top lid and bottom base in direct contact with each other, but with structural elements that are (i) flexible in the basal plane in order to allow for sliding with respect to the enclosure in one plane, and (ii) inflexible in other planes in order to provide structural support to the PCB. The structural elements may comprise helical springs, ball bearings, and/or low-shear modulus blocks. Using these structural elements as described in the detailed description below, the PCB and internal components of an SSD are partially decoupled from the enclosure in the basal plane to provide increased thermal cycling performance, yet still sufficiently anchored to the enclosure in order to provide protection from external forces.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

FIG. 1A is a cross-sectional side view of a data storage device including a PCB with internal components coupled thereon, an enclosure, and structural elements configured to partially disengage the PCB from the enclosure in accordance with some implementations.

FIG. 1B is a top view of the PCB included in the data storage device shown in FIG. 1A in accordance with some implementations.

FIG. 2 is a cross-sectional side view of a portion of the data storage device in FIGS. 1A-1B, with a detailed view of helical springs configured to decouple the PCB from the enclosure in accordance with some implementations.

FIG. 3 is a cross-sectional side view of a portion of the data storage device in FIGS. 1A-1B, with a detailed view of ball bearings configured to decouple the PCB from the enclosure in accordance with some implementations.

FIG. 4 is a cross-sectional side view of a portion of the data storage device in FIGS. 1A-1B, with a detailed view of low-shear modulus blocks configured to decouple the PCB from the enclosure in accordance with some implementations.

FIG. 5A is a cross-sectional side view of a data storage device including a PCB with internal components coupled thereon, an enclosure, and structural elements configured to partially disengage the PCB from the enclosure in accordance with some implementations.

FIG. 5B is a top view of the PCB included in the data storage device shown in FIG. 5A in accordance with some implementations.

FIG. 6 shows spring shear stiffness equations and tables of example PCB dimensions and spring shear stiffness values in accordance with some implementations.

DETAILED DESCRIPTION

Figure 7:
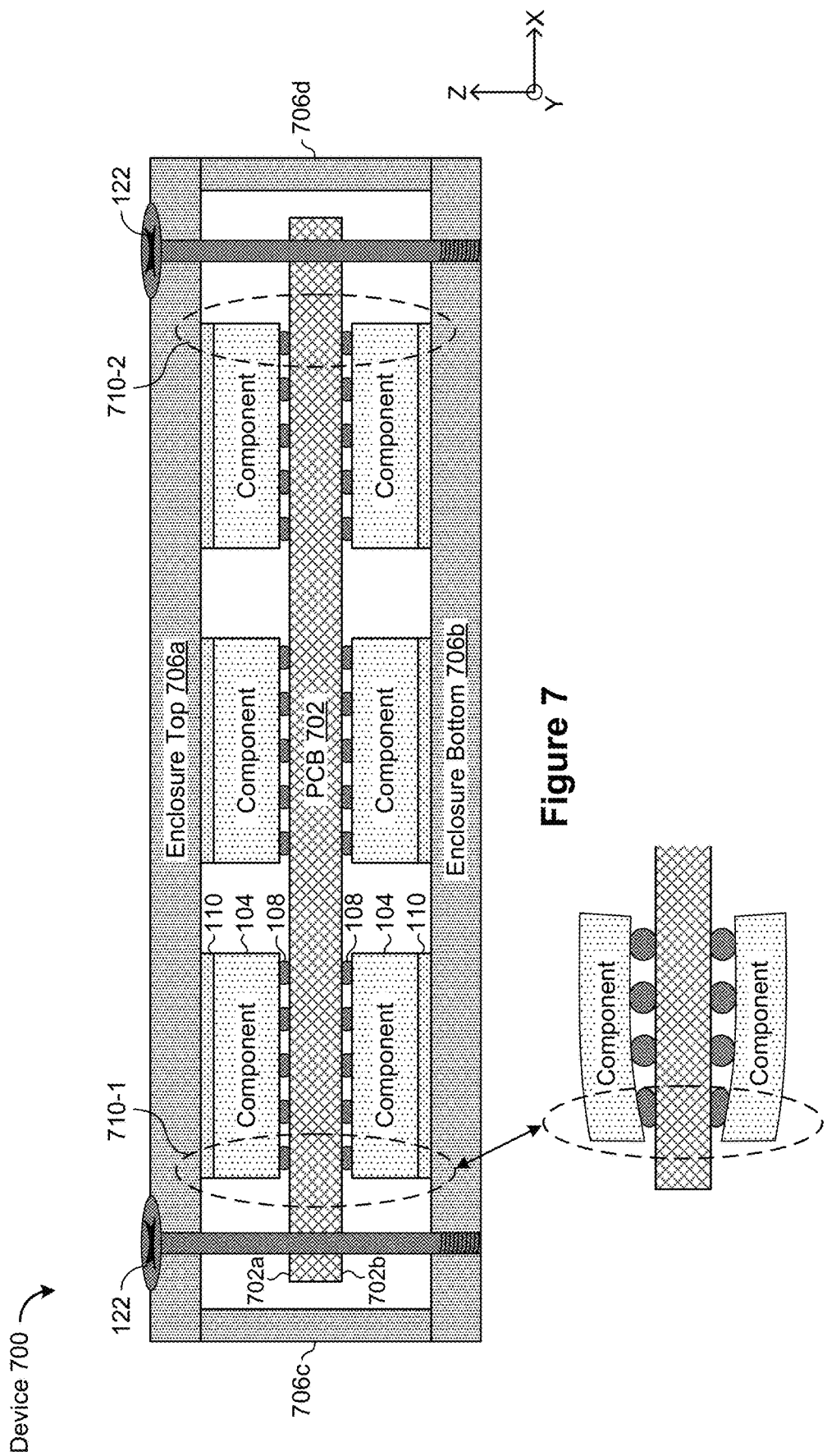
FIG. 7 is a cross-sectional side view of a data storage device including a PCB with internal components coupled thereon, an enclosure, and fittings coupling the PCB to the enclosure.

The present subject matter will now be described more fully hereinafter with reference to the accompanying Figures, in which representative embodiments are shown. The present subject matter can, however, be embodied in different forms and should not be construed as limited to the embodiments set forth herein. For example, although a semiconductor device for an SSD is discussed, it will be apparent to those of skill in the art that the concepts disclosed herein have much broader application than just SSDs. Thus, these embodiments are provided to describe and enable one of skill in the art. The elements illustrated in the accompanying Figures are not necessarily drawn to scale, but rather, may have been exaggerated to highlight the important features of the subject matter therein. Furthermore, the Figures may have been simplified by omitting elements that are not necessarily needed for the understanding of the disclosed embodiments.

FIG. 1A is a cross-sectional side view of a data storage device 100, and FIG. 1B is a top view of a PCB 102 included in device 100. Device 100 includes PCB 102 with internal components 104 coupled thereon (forming a PCB assembly), an enclosure 106, and structural elements 134 and 136 configured to partially disengage the PCB 102 from the enclosure 106 in accordance with some implementations. Device 100 may be implemented, for example, as a solid-state drive (SSD), a system-in-package (SiP), a secure digital (SD) card, a MultiMediaCard (MMC), or the like.

Internal components 104 include electronic components such as one or more semiconductor dies, including non-volatile memory components such as a flash memory chip (e.g., a NAND chip) for the storage of data. Components 104 are positioned on top surface 102a and bottom surface 102b of PCB 102. Additional components 104 may be positioned at other locations on PCB 102 in other examples. In some implementations, one or more components 104 may be controllers (e.g., a flash memory controller, controller die), which may be configured to manage data stored in other components 104 (e.g., memory chips) and to communicate with a computer or other electronic device to which device 100 may be connected during operation. In some implementations, one or more components 104 may be data storage dies (e.g., NAND dies), configured to store data accessible by devices external to device 100.

Disposed around PCB 102 and components 104 is an enclosure 106, which covers and protects the internal components of device 100. Enclosure 106 may be made from, for example, a plastic material or more preferably metal. Enclosure 106 may include multiple portions or pieces, including a top cover 106a (also referred to as a lid), bottom cover 106b (also referred to as a base), and sides 106c and 106d. In some implementations, sides 106c and 106d may not be separate components; rather, top 106a and bottom 106b components may be shaped such that they form an enclosure on their own. A gap filler 110 (e.g., a thermal interface material) may be placed between components 104 and enclosure 106, thereby conducting heat away from the components 104 and dispersing the heat through the enclosure, which provides thermal protection to device 100.

PCB 102 is both a mechanical base support for components 104 of device 100 and an electrical interface that provides access to components 104. As an electrical interface, PCB 102 includes a plurality of metal layers, including at least one layer for routing data using conductive (e.g., copper) traces, a ground layer, and/or a power layer. The plurality of metal layers include at least one layer in electrical contact with components 104 and solder bumps 108 upon which components 104 and other elements may be mounted.

Components 104 may be mounted to PCB 102 using flip chip mounting, in which the components 104 are electrically connected to the circuitry of PCB 102 via a solder joint array comprising a plurality of solder bumps 108. In this configuration, components 104 may be referred to as a flip chip. The solder bumps 108 interconnect components 104 to other circuitry within device 100 (e.g., controller(s) and/or other dies). Solder bumps 108 may be deposited on bond pads on the top side of components 104 during the final die processing step. In order to mount components 104 to PCB 102, each die is flipped over so that its top side faces down, and aligned so that its bond pads align with matching pads on the PCB 102, and then the solder bumps 108 are reheated (e.g., using a thermosonic bonding or reflow solder process) to produce electrical connection at each solder bump.

PCB 102 has a coefficient of thermal expansion (CTE) that is different from that of enclosure 106. Typically, the aforementioned CTE difference is about 10 ppm/° C. with CTE of components 104 on the lower side, although larger or smaller CTE differences may be possible, depending on the materials involved. As a result of the CTE mismatch, PCB 102 and enclosure 106 expand and contract at different rates when subject to changing temperatures. Since components 104 are coupled to both the PCB 102 (via solder balls 108) and the enclosure 106 (via thermal interface material 110), the CTE mismatch may cause solder joint thermal fatigue failure, which may involve cracking or decoupling of solder balls 108 from PCB 102 and/or component 104.

When an enclosure 106 is employed to protect device 100, the top lid 106a and the bottom base 106b may be assembled with fixation screws 122, which tightly clamp on the PCB's top and bottom surfaces 102a and 102b. When expanding or contracting, the enclosure 106 drags the PCB 102 with it through the screws 122. In one example, aluminum alloy may be used for enclosure 106 and has a CTE value that is about 10 ppm/° C. higher than PCB 102. Thus, the enclosure 106 effectively enhances the CTE of PCB 102 relative to components 104.

Fixation screws 122 and enclosure 106 play a significant role in the temperature and stress distribution over the PCB assembly, potentially having a dominant contribution on the lifetime of the overall device 100. To counteract these effects, an innovative enclosure design uses structural elements (134 and 136, described in detail below) that release enclosure constraints toward the PCB assembly improve ATC test conditions.

Referring to FIGS. 1A and 1B, PCB 102 is coupled to enclosure 106 with fittings 120 on a first side A and fittings 130 on a second side B. Each fitting 120, 130 includes a screw 122 that physically couples the enclosure top 106a to the enclosure bottom 106b.

In fittings 120, respective screws 122 anchor (physically couple) the PCB 102 to the top 106a and bottom 106b of the enclosure. Each fitting 120 may include structural elements (plastic or metal standoffs) 124 and 126, respectively disposed above and below the PCB 102, in order to provide structural support to the screw 122 and PCB 102 and maintain spacing between the enclosure top 106a, the PCB 102, and the enclosure bottom 106b.

In fittings 130, respective screws 122 physically couple the top 106a to the bottom 106b of the enclosure, but are disengaged (not in contact with) the PCB 102. These screws 122 pass through holes (cutouts) 132 in the PCB. These holes 132 have enough space in the basal plane (the X-Y plane) to ensure that corresponding screws 122 do not come in contact with the PCB 102. Each fitting 130 includes structural elements 134 and 136, respectively disposed above and below the PCB 102, in order to provide structural support to the PCB 102 in the +/−Z directions.

Structural elements 134 and 136 engage PCB 102 in the +/−Z directions (in every plane that is orthogonal to the basal plane), while disengaging PCB 102 in the basal plane. By engaging PCB 102 in the +/−Z directions, structural elements 134 and 136 prevent movement of the PCB 102 in the +/−Z directions relative to the enclosure top/bottom 106a/106b. By disengaging PCB 102 in the basal plane, structural elements 134 and 136 allow movement of the PCB 102 in the +/−X and +/−Y directions relative to the enclosure top/bottom 106a/106b. Thus, PCB 102 is flexible in the basal plane, and may therefore slide (partially or freely) in the basal plane relative to the enclosure 106, but is prevented from moving towards or away from the enclosure top/bottom 106a/106b.

Thus, rigid structural elements 124 and 126 disposed on side A of PCB 102 prevent movement of the PCB and enclosure relative to each other in the basal plane on side A. However, partially flexible structural elements 134 and 136 disposed on side B of PCB 102 allow the PCB and enclosure to slide relative to each other in the basal plane on side B. All of the structural elements 124, 126, 134, and 136 restrict (or substantially restrict) movement of the PCB and enclosure relative to each other in non-basal planes (e.g., in the +/−Z directions). Stated another way, half of PCB 102 is partially decoupled from enclosure 106 in the basal plane, with rigid structural elements 124 and 126 anchoring the PCB to the enclosure, and partially flexible structural elements 134 and 136 allowing XY movement but minimizing Z movement of the PCB relative to the enclosure.

Stated another way, rigid structural elements 124 and 126 in fittings 120 prevent (or substantially restrict) movement of side A of the PCB relative to the enclosure in all X, Y, and Z directions, while flexible structural elements 134 and 136 in fittings 130 prevent (or substantially restrict) movement of side B of the PCB relative to the enclosure in the Z directions and allow movement of side B of the PCB relative to the enclosure in the X and Y directions (in the basal plane). In one example, movement is "substantially restricted" if such movement is restricted by at least 90% compared to an amount of movement that could occur without restrictions. Other restriction thresholds may apply in other examples, depending on structural requirements of the internal components 104 and solder joints 108.

The flexibility in the basal plane on side B allows the PCB and enclosure to sufficiently freely slide in the basal plane relative to each other when expanding or shrinking during ATC testing, which can reduce and even eliminate the additional stress on solder joints 108 due to the higher CTE of the enclosure and hence resolve the adverse effect of enclosure to drive ATC performance. At the same time, the rigidness in the non-basal plane (in the Z directions) on side B, together with the rigidness in all planes on side A, protect PCB 102 from external forces (e.g., shock and vibrations) that tend to reduce reliability of device 100. Stated another way, even though partially flexible structural elements 134 and 136 allow for movement in the basal plane relative to the enclosure in order to enhance ATC testing performance, these elements still prevent harmful vibrations in the +/−Z directions relative to the enclosure. Thus, partially flexible structural elements provide a constraint (fixed support) in the +/−Z directions while allowing the PCB 102 to be partially disengaged from the enclosure in the +/−X/Y directions.

Thus, PCB 102 and enclosure 106 are partially disengaged due to the combination of rigid structural elements 124/126 in fittings 120 (side A) and partially flexible structural elements 134/136 in fittings 130 (side B). This partial disengagement balances the tradeoff between rigidity and flexibility in a way that both (i) optimizes ATC testing performance of device 100 and (ii) protects the internal components of device 100 from external forces. If each fitting of device 100 were configured as fitting 120, ATC testing performance would suffer. At the same time, if each fitting of device 100 were configured as fitting 130, PCB 102 would be too susceptible to external forces and reliability of device 100 would decrease. Thus, it is important for one side of the PCB (side A) to be rigidly coupled to the enclosure, and the other side of the PCB (side B) to be partially flexibly coupled to the enclosure (flexible in the basal plane and rigid in non-basal planes), thereby partially disengaging the PCB from the disclosure. Stated another way, it is important for one side of the PCB (side A) to be anchored to the enclosure, and the other side of the PCB (side B) to be partially decoupled from the enclosure (in the basal plane), thereby partially disengaging the PCB from the disclosure.

As illustrated in FIG. 1A, structural elements 134 and 136 may comprise helical springs, thus making screws 122 in fittings 130 spring-loaded screws. Structural element 134 is coupled to enclosure top 106a (or coupled to an extension of enclosure top 106a) on a first end, and side B of PCB 102 (around hole 132) on a second end. Structural element 136 is coupled to enclosure bottom 106b (or coupled to an extension of enclosure bottom 106b) on a first end, and side B of PCB 102 (around hole 132) on a second end. The helical springs may be disposed in a conical configuration as illustrated in FIG. 1A, or in a cylindrical configuration as illustrated in FIG. 2.

FIGS. 2-4 are cross-section side views of alternative implementations of fitting 130 of device 100 in accordance with some implementations.

Referring to FIG. 2, fitting 130-2 includes helical springs 134-2 and 136-2, each arranged in a cylindrical configuration. Spring 134-2 is coupled to enclosure top 106a (or coupled to an extension of enclosure top 106a) on a first end, and side B of PCB 102 (around hole 132) on a second end. Spring 136-2 is coupled to enclosure bottom 106b (or coupled to an extension of enclosure bottom 106b) on a first end, and side B of PCB 102 (around hole 132) on a second end. The springs allow movement of PCB 102 relative to enclosure 106 in the basal plane (thereby decoupling the PCB from the enclosure in the basal plane), and they restrict movement of PCB 102 relative to enclosure 106 out of the basal plane.

Referring to FIG. 3, fitting 130-3 includes ball bearings (or pluralities of ball bearings) 134-3 and 136-3. Ball bearings 134-3 are disposed between enclosure top 106a (or an extension of enclosure top 106a) and side B of PCB 102 (around hole 132). Ball bearings 136-3 is disposed between enclosure bottom 106b (or an extension of enclosure bottom 106b) and side B of PCB 102 (around hole 132). The ball bearings allow movement of PCB 102 relative to enclosure 106 in the basal plane (thereby decoupling the PCB from the enclosure in the basal plane), and they restrict movement of PCB 102 relative to enclosure 106 out of the basal plane.

Referring to FIG. 4, fitting 130-4 includes low-shear modulus blocks 134-4 and 136-4, each comprising a material having a low-shear modulus (flexibility) in the basal plane. Block 134-4 is disposed between enclosure top 106a (or an extension of enclosure top 106a) and side B of PCB 102 (around hole 132). Block 136-4 is disposed between enclosure bottom 106b (or an extension of enclosure bottom 106b) and side B of PCB 102 (around hole 132). The low-shear modulus blocks allow movement of PCB 102 relative to enclosure 106 in the basal plane (thereby decoupling the PCB from the enclosure in the basal plane), and they restrict movement of PCB 102 relative to enclosure 106 out of the basal plane.

Other implementations (not depicted in the figures) of fitting 130 may include other materials or components, as long as the materials or components are flexible in the basal plane and rigid (or substantially rigid) out of the basal plane, thereby disengaging side B of PCB 102 from enclosure 106 in the basal plane while the aforementioned components expand and shrink during ATC testing.

Thus, in one example, a solid-state drive 100 comprises an enclosure 106 having a top portion 106a and a bottom portion 106b forming an interior cavity; a PCB assembly 102, wherein the PCB assembly is disposed in the interior cavity of the enclosure, extends in a basal plane; and has a top surface 102a, a bottom surface 102b, a first end A, and a second end B; a first plurality of semiconductor memory packages 104 electromechanically bonded to the top surface 102a of the PCB assembly with solder joints 108 and coupled to the top portion 106a of the enclosure with thermal interface material 110; a second plurality of semiconductor memory packages 104 electromechanically bonded to the bottom surface 102b of the PCB assembly and coupled to the bottom portion 106b of the enclosure with thermal interface material 110; a first fitting 120 coupled to the first end A of the PCB assembly, the top portion 106a of the enclosure, and the bottom portion 106a of the enclosure, wherein the first fitting restricts movement of the PCB assembly in the basal plane (in the XY direction) with respect to the enclosure and restricts movement of the PCB assembly out of the basal plane (in the Z direction); and a second fitting 130 coupled to the second end B of the PCB assembly, the top portion 106a of the enclosure, and the bottom portion 106b of the enclosure, wherein the second fitting allows movement of the PCB assembly in the basal plane with respect to the enclosure (in the XY direction); and restricts movement of the PCB assembly out of the basal plane (in the Z direction).

In some implementations, the first fitting 120 anchors the first end of the PCB assembly to the enclosure; and the second fitting partially restrains the second end of the PCB assembly to the enclosure, allowing the PCB assembly to move in the basal plane with respect to the enclosure.

In some implementations, the first fitting 120 comprises a first screw 122 that is anchored to the first end of the PCB assembly, the top portion of the enclosure, and the bottom portion of the enclosure; and the second fitting comprises a second screw 122 that is anchored to the top portion of the enclosure and the bottom portion of the enclosure and decoupled from the PCB assembly (positioned through hole 132).

In some implementations, the second fitting 130 comprises a first helical spring 134 (or 134-2) disposed about a portion of the second screw above the top surface of the PCB assembly; and a second helical spring 136 (or 136-2) disposed about a portion of the second screw below the bottom surface of the PCB assembly. In some implementations, the first helical spring 134 (or 134-2) is coupled to the top portion of the enclosure (or an extension of the top portion of the enclosure) and the top surface of the PCB assembly; and the second helical spring 136 (or 136-2) is coupled to the bottom portion of the enclosure (or an extension of the bottom portion of the enclosure) and the bottom surface of the PCB assembly.

In some implementations, the second fitting 130 comprises a first plurality of ball bearings 134-3 disposed about a portion of the second screw above the top surface of the PCB assembly; and a second plurality of ball bearings 136-3 disposed about a portion of the second screw below the bottom surface of the PCB assembly. In some implementations, the first plurality of ball bearings 134-3 are in contact with the top portion of the enclosure (or an extension of the top portion of the enclosure) and the top surface of the PCB assembly; and the second plurality of ball bearings 136-3 are in contact with the bottom portion of the enclosure (or an extension of the bottom portion of the enclosure) and the bottom surface of the PCB assembly.

In some implementations, the second fitting 130 comprises a first low-shear modulus block 134-4 disposed about a portion of the second screw above the top surface of the PCB assembly; and a second low-shear modulus block 136-4 disposed about a portion of the second screw below the bottom surface of the PCB assembly. In some implementations, the first low-shear modulus block 134-4 is coupled to the top portion of the enclosure (or an extension of the top portion of the enclosure) and the top surface of the PCB assembly; and the second low-shear modulus block 136-4 is coupled to the bottom portion of the enclosure (or an extension of the bottom portion of the enclosure) and the bottom surface of the PCB assembly.

In some implementations, the solid-state drive further comprises a connector coupled to the PCB assembly. In some implementations, the connector is disposed at the first end of the PCB assembly (area 510); and the first and second pluralities of semiconductor memory packages are disposed at the second end of the PCB assembly (area 520).

In some implementations, the first and second pluralities of semiconductor memory packages are electromechanically bonded to the PCB assembly with solder joint arrays 108.

FIG. 5A is a cross-sectional side view of a data storage device 500 including a PCB 502 with internal components coupled thereon, an enclosure 506 (including top 506a, bottom 506b, and sides 506c and 506d), and structural elements (fittings 130) configured to partially disengage the PCB from the enclosure in accordance with some implementations, and FIG. 5B is a top view of PCB 502.

Device 500 corresponds to device 100, but with a different layout of internal components. Likewise, PCB 502 corresponds to PCB 102, but with a different layout of internal components coupled thereon, and enclosure 506 corresponds to enclosure 106. Thus, the features described above with reference to device 100, PCB 102, and enclosure 106 also apply to device 500, PCB 502, and enclosure 506 in FIGS. 5A and 5B.

Device 500 includes a first area 510 corresponding to a portion of PCB 502 on which non-data storage components (e.g., controllers and/or connectors) are mounted. The components mounted to PCB 502 in area 510 are coupled in such a way as to not be subject to ATC testing failure. Specifically, the CTE mismatch between PCB 502 and enclosure 506 does not affect the solder joints of the internal components in area 510. This may be due to any of the configuration or strength of the solder joints, chip pinout, and so forth.

Device 500 includes a second area 520 corresponding to a portion of PCB 502 on which data storage components (e.g., NAND devices) are mounted. As such, area 520 may be referred to as NAND-populated area 520. In other examples, however, data storage devices other than NAND devices may be included in area 520. Unlike area 510, the CTE mismatch between PCB 502 and enclosure 506 does affect the solder joints of the internal components in area 520. Thus, PCB 502 and enclosure 506 are partially disengaged in area 520.

Area 510 of PCB 502 is anchored to enclosure 506 by the use of fittings 120 (comprising rigid structural elements as described above) throughout the area. By anchoring area 510 of PCB 502 to enclosure 506, rotation of the PCB is prevented, which prevents damage to any connector components mounted on the PCB in area 510.

NAND-populated area 520 of PCB 502 is partially disengaged from enclosure 506 by the use of fittings 130 throughout the area (comprising partially flexible structural elements as described above), with fittings 120 (comprising rigid structural elements as described above) anchoring one side of the area 520. By partially disengaging area 520 of PCB 502 from enclosure 506, ATC testing performance is optimized (for the reasons described above).

FIG. 6 shows spring shear stiffness equations and tables of example PCB dimensions and spring shear stiffness values for the springs in fittings 130 (in devices 100 and 500) in accordance with some implementations.

Taking spring loaded enclosure as an example (as illustrated in fittings 130 in FIGS. 1A and 2), a thermomechanics model may be used to estimate the percentage of stress relief as a function of spring shear constant for springs 134 and 136 (FIGS. 1A and 2), as summarized in FIG. 6. The stress relief is referred to as a reduction from the total thermal stress built up as if the PCB were to be tightly clamped by the enclosure top lid and bottom base during ATC testing.

In this model, it is assumed that the PCB and enclosure are fixed with screws 122 at one end (fittings 120), but at the other end the PCB is only partially restrained by the springs (fittings 130). For a typical drive dimension and typical material properties, the residual thermal stress in the PCB upon partial relief can be estimated as shown in the table at the lower-right corner of FIG. 6. It can be seen that for 99% thermal stress relief (1% left), spring shear stiffness below 18.5 N/mm is required; for 90% thermal stress relief (10% left), spring shear stiffness below 203.5 N/mm is required; for 80% thermal stress relief (20% left), spring shear stiffness below 458 N/mm is required; and for 70% thermal stress relief (30% left), spring shear stiffness below 785 N/mm is required. This model provides an estimate of the spring shear stiffness by order of magnitude for desired level of thermal stress relief from the enclosure effect during ATC testing.

FIG. 7 is a cross-sectional side view of a data storage device 700 including a PCB 702 with internal components (e.g., NAND chips) 104 coupled thereon, an enclosure 706, and screws 122 coupling the PCB to the enclosure. Device 700 corresponds to device 100, PCB 702 corresponds to PCB 102, and enclosure 706 corresponds to enclosure 106. Thus, the features described above with reference to device 100, PCB 102, and enclosure 106 also apply to device 700, PCB 702, and enclosure 706 in FIG. 7.

In device 700, screws 122 anchor the PCB 702 to the enclosure 706, as described above with reference to fittings 120. However, the screws in device 700 do not include standoffs or spacers (e.g., structural elements 124 and 126, FIG. 1A). Therefore, due to enclosure screwing pressure, components 104 disposed close to the screws 122 at the edges of PCB 702 (regions 710-1 and 710-2) may be over-compressed. Such over-compression reduces reliability of the corresponding solder joints 108, which may cause device failure (e.g., due to cracking of the affected solder joints).

Figure 8:
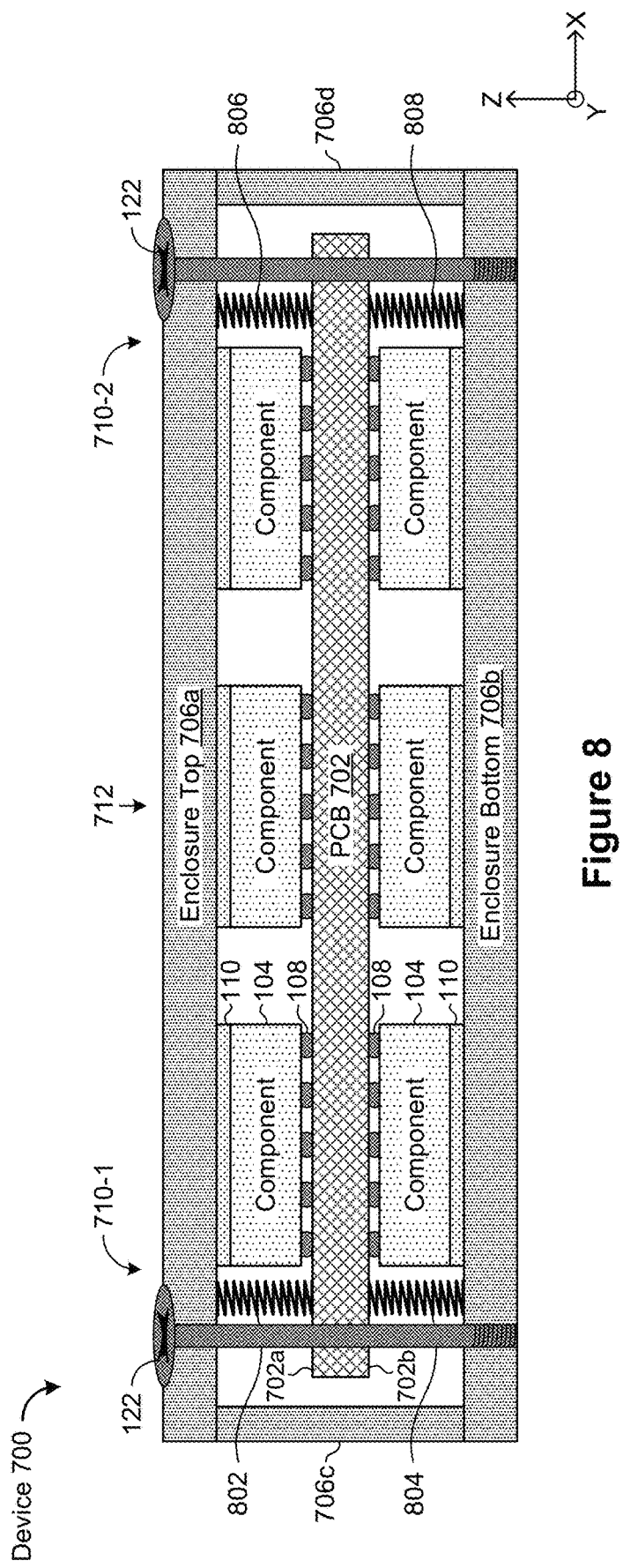
FIG. 8 is a cross-sectional side view of a data storage device including a PCB with internal components coupled thereon, an enclosure, fittings coupling the PCB to the enclosure, and structural elements protecting the internal components from compression in accordance with some implementations.

FIG. 8 is a cross-sectional side view of a data storage device 700, with the addition of structural elements 802, 804, 806, and 80 (e.g., springs) installed between the screws 122 and the internal components 104 disposed close to the screws. These structural elements protect the components 104 at the edges of PCB 702 from the aforementioned over-compression. Stated another way, with springs installed between NANDs and screws, each NAND can be protected from over-compression.

In region 710-1, structural element 802 is coupled to enclosure top 706a and top surface 702a of PCB 702 between screw 122 and component 104, and structural element 804 is coupled to enclosure bottom 706b and bottom surface 702b of PCB 702 between screw 122 and component 104. In region 710-2, structural element 806 is coupled to enclosure top 706a and top surface 702a of PCB 702 between screw 122 and component 104, and structural element 808 is coupled to enclosure bottom 706b and bottom surface 702b of PCB 702 between screw 122 and component 104.

For implementations in which structural elements 802, 804, 806, and 808 comprise springs, the stiffness factor of the springs can be adjusted to meet design requirements. Further, since springs may be mechanically compliant to any compression, no mechanical tolerance issues are introduced.

In addition to minimizing over-compression of the internal components close to screws 122 (in regions 710-1 and 710-2), structural elements 802, 804, 806, and 808 minimize bulging on the enclosure center area (region 712), as springs can balance the compression caused by screws 122 and make pressure evenly distributed throughout the internal components 104.

In some implementations, structural elements 802/804 and/or 806/808 may be included in devices 100 (FIG. 1A) or 500 (FIG. 5A). Further, in some implementations, fittings 130 (FIGS. 1A and 2-4) may supplement screw 122 in region 710-2 of device 700. Lastly, in some implementations, screw 122 and structural elements 802/804 in region 710-1 of device 700 may replace fittings 120 in devices 100 (FIG. 1A) or 500 (FIG. 5A).

Thus, in one example, a solid-state drive comprises an enclosure having a top portion 706a and a bottom portion 706b forming an interior cavity; a PCB assembly 702, wherein the PCB assembly is disposed in the interior cavity of the enclosure and has a top surface 702a, a bottom surface 702b, a first end (region 710-1), and a second end (region 710-2); a first plurality of semiconductor memory packages 104 electromechanically bonded to the top surface of the PCB assembly and coupled to the top portion of the enclosure with thermal interface material; a second plurality of semiconductor memory packages 104 electromechanically bonded to the bottom surface of the PCB assembly and coupled to the bottom portion of the enclosure with thermal interface material; a first screw 122 (region 710-1) coupled to the first end of the PCB assembly, the top portion of the enclosure, and the bottom portion of the enclosure; a second screw 122 (region 710-2) coupled to the second end of the PCB assembly, the top portion of the enclosure, and the bottom portion of the enclosure; a first helical spring 802 disposed adjacent to the first screw and coupled to the top portion of the enclosure and the top surface of the PCB assembly; a second helical spring 804 disposed adjacent to the first screw and coupled to the bottom portion of the enclosure and the bottom surface of the PCB assembly; a third helical spring 806 disposed adjacent to the second screw and coupled to the top portion of the enclosure and the top surface of the PCB assembly; and a fourth helical spring 804 disposed adjacent to the second screw and coupled to the bottom portion of the enclosure and the bottom surface of the PCB assembly.

In some implementations, the first helical spring 802 is disposed between the first screw and a first semiconductor memory package 104 of the first plurality of semiconductor memory packages (mounted to the top surface 702a of the PCB); the second helical spring 804 is disposed between the first screw and a first semiconductor memory package of the second plurality of semiconductor memory packages (mounted to the bottom surface 702b of the PCB); the third helical spring 806 is disposed between the second screw and a second semiconductor memory package of the first plurality of semiconductor memory packages (mounted to the top surface 702a of the PCB); and the fourth helical spring 808 is disposed between the second screw and a second semiconductor memory package of the second plurality of semiconductor memory packages (mounted to the bottom surface 702b of the PCB).

In some implementations, the first and second helical springs 802 and 804 balance compression of the enclosure caused by the first screw 122 (in region 710-1); and the third and fourth helical springs 806 and 808 balance compression of the enclosure caused by the second screw 122 (in region 710-2).

In some implementations, the first and second pluralities of semiconductor memory packages are electromechanically bonded to the PCB assembly with solder joint arrays 108.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

Rewrite the pending claims as follows:

1. A solid-state drive, comprising:
an enclosure having a top portion and a bottom portion forming an interior cavity;
a printed circuit board (PCB) assembly, wherein the PCB assembly:
is disposed in the interior cavity of the enclosure;
extends in a basal plane; and
has a top surface, a bottom surface, a first end, and a second end;
a first plurality of semiconductor memory packages electromechanically bonded to the top surface of the PCB assembly and coupled to the top portion of the enclosure with thermal interface material;
a second plurality of semiconductor memory packages electromechanically bonded to the bottom surface of the PCB assembly and coupled to the bottom portion of the enclosure with thermal interface material;
a first fitting comprising a first screw that is coupled to the first end of the PCB assembly, the top portion of the enclosure, and the bottom portion of the enclosure, wherein the first fitting:
restricts movement of the PCB assembly in the basal plane with respect to the enclosure; and
restricts movement of the PCB assembly out of the basal plane; and
a second fitting coupled to the second end of the PCB assembly, the top portion of the enclosure, and the bottom portion of the enclosure, wherein the second fitting comprises:
a second screw that is:
coupled to the top portion of the enclosure and the bottom portion of the enclosure; and
decoupled from the PCB assembly; and
first and second structural elements that are:
respectively coupled to the top and bottom portions of the enclosure;
respectively coupled to the top and bottom surfaces of the PCB assembly; and
decoupled from the second screw;
wherein the first and second structural elements:
allow movement of the PCB assembly in the basal plane with respect to the enclosure; and
restrict movement of the PCB assembly out of the basal plane; and
wherein:
the first structural element comprises a first helical spring disposed about a portion of the second screw above the top surface of the PCB assembly;
the second structural element comprises a second helical spring disposed about a portion of the second screw below the bottom surface of the PCB assembly;
the first helical spring is directly coupled to the top portion of the enclosure and the top surface of the PCB assembly; and
the second helical spring is directly coupled to the bottom portion of the enclosure and the bottom surface of the PCB assembly.

2. The solid-state drive of claim 1, wherein the second fitting comprises:
the first structural element comprises a first low-shear modulus block disposed about a portion of the second screw above the top surface of the PCB assembly; and
the first structural element comprises a second low-shear modulus block disposed about a portion of the second screw below the bottom surface of the PCB assembly.

3. The solid-state drive of claim 2, wherein:
the first low-shear modulus block is directly coupled to the top portion of the enclosure and the top surface of the PCB assembly; and
the second low-shear modulus block is directly coupled to the bottom portion of the enclosure and the bottom surface of the PCB assembly.

4. The solid-state drive of claim 1, further comprising a connector coupled to the PCB assembly.

5. The solid-state drive of claim 4, wherein:
the connector is disposed at the first end of the PCB assembly; and the first and second pluralities of semiconductor memory packages are disposed at the second end of the PCB assembly.

6. The solid-state drive of claim 1, wherein the first and second pluralities of semiconductor memory packages are electromechanically bonded to the PCB assembly with solder joint arrays.

7. A solid-state drive, comprising:
an enclosure having a top portion and a bottom portion forming an interior cavity;
a printed circuit board (PCB) assembly, wherein the PCB assembly:
  is disposed in the interior cavity of the enclosure;
  extends in a basal plane; and
  has a top surface, a bottom surface, a first end, and a second end;
a first plurality of semiconductor memory packages electromechanically bonded to the top surface of the PCB assembly and coupled to the top portion of the enclosure with thermal interface material;
a second plurality of semiconductor memory packages electromechanically bonded to the bottom surface of the PCB assembly and coupled to the bottom portion of the enclosure with thermal interface material;
a first fitting comprising a first screw that is coupled to the first end of the PCB assembly, the top portion of the enclosure, and the bottom portion of the enclosure, wherein the first fitting:
  restricts movement of the PCB assembly in the basal plane with respect to the enclosure; and
  restricts movement of the PCB assembly out of the basal plane; and
a second fitting coupled to the second end of the PCB assembly, the top portion of the enclosure, and the bottom portion of the enclosure, wherein the second fitting comprises:
  a second screw that is:
    coupled to the top portion of the enclosure and the bottom portion of the enclosure; and
    decoupled from the PCB assembly; and
  first and second structural elements that are:
    respectively coupled to the top and bottom portions of the enclosure;
    respectively coupled to the top and bottom surfaces of the PCB assembly; and
    decoupled from the second screw;
  wherein the first and second structural elements:
    allow movement of the PCB assembly in the basal plane with respect to the enclosure; and
    restrict movement of the PCB assembly out of the basal plane; and
  wherein the second fitting comprises:
    the first structural element comprises a first plurality of ball bearings disposed about a portion of the second screw above the top surface of the PCB assembly; and
    the first structural element comprises a second plurality of ball bearings disposed about a portion of the second screw below the bottom surface of the PCB assembly.

8. The solid-state drive of claim 7, wherein:
the first plurality of ball bearings are in contact with the top portion of the enclosure and the top surface of the PCB assembly; and
the second plurality of ball bearings are in contact with the bottom portion of the enclosure and the bottom surface of the PCB assembly.

9. A solid-state drive, comprising:
an enclosure having a top portion and a bottom portion forming an interior cavity;
a printed circuit board (PCB) assembly, wherein the PCB assembly:
  is disposed in the interior cavity of the enclosure; and
  has a top surface, a bottom surface, a first end, and a second end;
a first plurality of semiconductor memory packages electromechanically bonded to the top surface of the PCB assembly and coupled to the top portion of the enclosure with thermal interface material;
a second plurality of semiconductor memory packages electromechanically bonded to the bottom surface of the PCB assembly and coupled to the bottom portion of the enclosure with thermal interface material;
a first screw coupled to the first end of the PCB assembly, the top portion of the enclosure, and the bottom portion of the enclosure;
a second screw coupled to the second end of the PCB assembly, the top portion of the enclosure, and the bottom portion of the enclosure;
a first helical spring disposed adjacent to the first screw and directly coupled to the top portion of the enclosure and the top surface of the PCB assembly;
a second helical spring disposed adjacent to the first screw and directly coupled to the bottom portion of the enclosure and the bottom surface of the PCB assembly;
a third helical spring disposed adjacent to the second screw and directly coupled to the top portion of the enclosure and the top surface of the PCB assembly; and
a fourth helical spring disposed adjacent to the second screw and directly coupled to the bottom portion of the enclosure and the bottom surface of the PCB assembly.

10. The solid-state drive of claim 9, wherein:
the first helical spring is disposed between the first screw and a first semiconductor memory package of the first plurality of semiconductor memory packages;
the second helical spring is disposed between the first screw and a first semiconductor memory package of the second plurality of semiconductor memory packages;
the third helical spring is disposed between the second screw and a second semiconductor memory package of the first plurality of semiconductor memory packages; and
the fourth helical spring is disposed between the second screw and a second semiconductor memory package of the second plurality of semiconductor memory packages.

11. The solid-state drive of claim 9, wherein:
the first and second helical springs are configured to balance compression of the enclosure caused by the first screw; and
the third and fourth helical springs are configured to balance compression of the enclosure caused by the second screw.

12. The solid-state drive of claim 9, wherein the first and second pluralities of semiconductor memory packages are electromechanically bonded to the PCB assembly with solder joint arrays.

* * * * *